United States Patent
May et al.

(10) Patent No.: US 9,264,084 B2
(45) Date of Patent: Feb. 16, 2016

(54) RADIO RECEIVER HAVING ENHANCED AUTOMATIC GAIN CONTROL CIRCUITRY

(71) Applicant: Silicon Laboratories Inc., Austin, TX (US)

(72) Inventors: Mark May, Austin, TX (US); Steve Hanawalt, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 271 days.

(21) Appl. No.: 13/905,954

(22) Filed: May 30, 2013

(65) Prior Publication Data

US 2014/0357211 A1    Dec. 4, 2014

(51) Int. Cl.
*H04B 1/06* (2006.01)
*H04B 1/12* (2006.01)
*H04B 1/10* (2006.01)
*H03G 3/00* (2006.01)
*H03G 3/30* (2006.01)

(52) U.S. Cl.
CPC ............. *H04B 1/123* (2013.01); *H03G 3/008* (2013.01); *H03G 3/3068* (2013.01); *H04B 1/109* (2013.01)

(58) Field of Classification Search
None
See application file for complete search history.

(56) References Cited

U.S. PATENT DOCUMENTS

| | | | | |
|---|---|---|---|---|
| 7,443,243 B2* | 10/2008 | Kanou | ...................... | H03F 1/26 330/284 |
| 7,711,334 B2* | 5/2010 | Sivasubramaniam | .... | H04B 1/18 455/130 |
| 8,290,457 B2 | 10/2012 | Li | | |
| 2010/0120391 A1* | 5/2010 | Kasha | ................. | H03F 3/45183 455/341 |
| 2012/0157031 A1 | 6/2012 | Strickland et al. | | |
| 2013/0241651 A1* | 9/2013 | Yu | ....................... | H03F 3/45188 330/253 |
| 2014/0022019 A1* | 1/2014 | Trulls Fortuny | ..... | H03G 1/0029 330/284 |
| 2015/0035595 A1* | 2/2015 | Harwalkar | .............. | H03F 1/223 330/185 |
| 2015/0092892 A1* | 4/2015 | Yoshikawa | ............... | H04B 1/18 375/340 |

* cited by examiner

*Primary Examiner* — Lana N Le
(74) *Attorney, Agent, or Firm* — Trop, Pruner & Hu, P.C.

(57) ABSTRACT

An apparatus includes an input terminal to receive a radio frequency (RF) signal and to communicate the RF signal to a low noise amplifier (LNA) via an input signal path, and a capacitor attenuator coupled to the input terminal to attenuate the RF signal by a controllable amount and having a first portion controllable to include a used part configured on the input signal path and an unused part coupled between the input signal path and an AC reference node, and a second portion coupled between the LNA and the AC reference node.

12 Claims, 6 Drawing Sheets

RADIO RECEIVER HAVING ENHANCED AUTOMATIC GAIN CONTROL CIRCUITRY

BACKGROUND

When an amplitude modulated (AM) radio frequency receiver moves near a source of low frequency noise (such as power line noise, traffic light noise, Integrated Services Digital Network (ISDN) noise, other low frequency noise and their associated harmonics), low frequency noise couples into the received AM signal, producing interference, which can sometimes be presented as a distorted audio signal including static and/or interfering channel signals. Many receivers include a low frequency "trap" circuit, including an inductor/resistor circuit, coupled to a signal input (such as a whip antenna) to filter the relatively low frequency power-line noise from the received AM radio frequency signal. However, such circuitry adds to the overall cost and size of the circuit, and the "trap" circuit degrades the received AM radio frequency signal by adding a constant degradation to the signal even when no low frequency noise is present.

SUMMARY OF THE INVENTION

According to one aspect, an apparatus includes an input terminal to receive a radio frequency (RF) signal and to communicate the RF signal to a low noise amplifier (LNA) via an input signal path, and a capacitor attenuator coupled to the input terminal to attenuate the RF signal by a controllable amount and having a first portion controllable to include a used part configured on the input signal path and an unused part coupled between the input signal path and an AC reference node, and a second portion coupled between the LNA and the AC reference node. A capacitance of the first and second portions may be controlled responsive to a strength of the RF signal.

The apparatus may further include a second terminal to couple to the AC reference node that is external to the apparatus, where the unused part of the first portion is coupled to the second terminal. The input signal path is coupled to communicate the RF signal to a first input terminal of the LNA, and the AC reference node is coupled via a capacitor to a second input terminal of the LNA. In turn, a detector is to generate a crossing signal responsive to detection of a zero crossing of the RF signal, and a control logic is to receive at least one control signal and to provide the at least one control signal to control at least the first portion of the capacitor attenuator upon the zero crossing of the RF signal.

In an embodiment, the first portion of the capacitor attenuator includes a plurality of capacitors, each having a first terminal coupled to the input terminal and a second terminal coupled to a switching node, where the switching node is to couple to the LNA via a first switch and to couple to the AC reference node via a second switch A first detector is coupled to receive the RF signal and to generate a first automatic gain control (AGC) signal based on comparison of the RF signal to a first threshold value, where the capacitor attenuator is controlled responsive to the first AGC signal. In turn, a second detector is to receive the RF signal via a low pass filter and to generate a second AGC signal based on comparison of the RF signal to a second threshold value.

A first resistor attenuator may be coupled to the input terminal to attenuate low frequency noise, and which may be controllable based at least in part on the second AGC signal. A second resistor attenuator may be coupled to the input terminal to further attenuate the RF signal when the RF signal is greater than a predetermined threshold. The second resistor attenuator can be disabled when an attenuation range of the capacitor attenuator is sufficient to fully attenuate the RF signal, when the RF signal is less than the predetermined threshold.

In another aspect, a system includes an antenna to receive a RF signal and a receiver coupled to the antenna to receive the RF signal via a first pin. In turn, the receiver includes an input signal path to communicate the RF signal, a LNA coupled to receive the RF signal via the input signal path and to amplify the RF signal, a capacitor attenuator coupled between the first pin, the LNA, and a second pin and having a controllable capacitance to attenuate the RF signal, a detection circuit including a detector to detect a zero crossing of the RF signal, and a controller to update a capacitance of the capacitor attenuator and to cause a digital signal processor (DSP) to compensate for the update to the capacitance, responsive to the zero crossing.

Yet another aspect is directed to a method including receiving a RF signal in a radio receiver and amplifying the RF in a LNA, detecting a level of the RF signal and a zero crossing of the RF signal in detector circuitry of the radio receiver, and at the zero crossing of the RF signal, updating an attenuation level of an attenuator of the radio receiver based on the detected level of the RF signal. Also at the zero crossing, a signal may be sent to a DSP to enable digital compensation for the attenuation level update.

DETAILED DESCRIPTION

In various embodiments, a radio receiver includes circuitry to detect signal strength present across a wide range of frequencies received in the receiver and to automatically and independently attenuate and filter in at least several different ranges. In an embodiment a radio receiver, which may be configured as a single semiconductor die of an integrated circuit (IC), includes an input terminal for receiving a radio frequency (RF) signal and one or more attenuation networks coupled to the input terminal. The attenuation network(s) are controlled responsive to one or more control signals from a controller to selectively adjust at least one of a resistive attenuation to filter low frequency noise and a capacitive attenuation, which is wideband and variable to attenuate all frequencies, to apply a desired attenuation to the RF signal.

As used herein, the term "RF signal" refers to a signal having a frequency within a range of about 100 kilohertz (kHz) to several gigahertz. For example, medium wave radio frequency signals (AM radio signals) are within a range of approximately 520 kHz to 1.71 MHz. Within AM radio signals, the signal content is contained within the amplitude of the signal, which strength can be used to specify the sounds to be reproduced by a speaker, for example. Further, as used herein, the term "low frequency noise" refers to signals having a frequency below the AM radio frequency range, including low frequency noise of 100 kilohertz or less, which may include so-called "mains" noise at approximately 60 Hertz resulting from location of the receiver near a noise source such as power lines.

Figure 1:
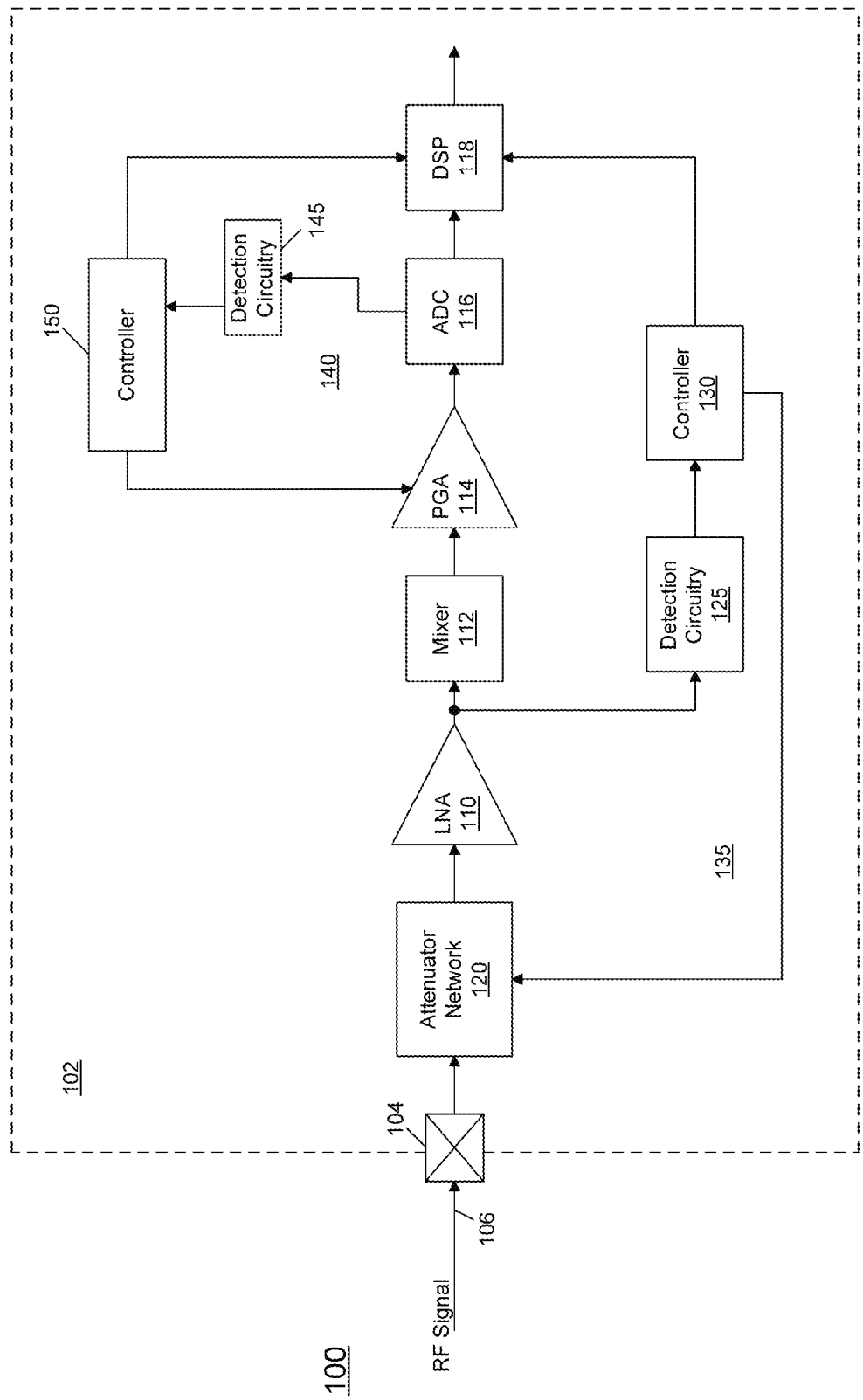
FIG. 1 is a block diagram of a radio receiver.

Referring now to FIG. 1, shown is a block diagram of a receiver in accordance with an embodiment. Receiver circuit 100 includes an integrated circuit 102 having an input terminal 104 such as an input pin of the IC for receiving a RF signal 106. In an example, the RF input signal 106 is received from a signal source, such as an antenna. In a particular example, the antenna can be a whip antenna configured to receive a variety of radio frequency signals, including AM radio frequency signals within a range of approximately 520 kHz to approximately 1.7 MHz. In some instances, the antenna may also receive interfering signals, such as low frequency power line noise from nearby power lines or noise from other sources (including traffic signals and/or various nearby obstructions).

Integrated circuit 102 includes an attenuator network 120, which as described further below is formed of multiple independent attenuator networks including at least one capacitor attenuator network and at least one resistor attenuator network. In turn, attenuator network 120 is coupled to a low noise amplifier (LNA) 110 having an input coupled to input terminal 104 via attenuator network 120 and an output, which is connected to an input of a mixer 112. In an embodiment, mixer 112 downconverts the incoming RF signal to a lower frequency signal such as an intermediate frequency (IF) signal. Mixer 112 includes an output connected to an input of a programmable gain amplifier (PGA) 114, which has an output connected to an input of an analog-to-digital converter (ADC) 116. ADC 116 has an output connected to a digital signal processor (DSP) 118. Attenuator network 120, LNA 110, mixer 112, PGA 114, and ADC 116 provide a first signal path from input terminal 104 to DSP 118. DSP 118 may perform digital demodulation and other processing on the digitized output of ADC 116 to generate a demodulated output.

As further seen in FIG. 1, integrated circuit 102 further includes a first automatic gain control (AGC) circuit 135. In the embodiment of FIG. 1, AGC circuit 135 is an RF AGC circuit that generally includes a feedback loop to receive feedback regarding the RF signal and determine appropriate levels for gain control circuitry of the analog front end. More specifically in the embodiment of FIG. 1, AGC circuit 135 is configured to control attenuator 120. As seen, AGC circuit 135 includes a detection circuitry 125 and a controller 130. In various embodiments, multiple detectors may be present within detection circuitry 125, each configured to receive the output of LNA 110, which in an embodiment is a differential amplified RF signal, and to detect various information based on this signal. One such detector may be configured to detect a signal strength of the amplified RF signal, while another detector may be configured to detect the presence of low frequency noise. Still further, an additional detector may be configured to detect zero crossings of the amplified RF signal. Although in FIG. 1 it is the output of LNA 110 that is provided to the detection circuitry understand in other implementations, the RF signal from any point in the input signal path in front of LNA may equally be provided to the detection circuitry.

As further seen, detection circuitry 125 is coupled to controller 130 which in different implementations may be standalone logic circuitry or a microcontroller (MCU). In still other embodiments, controller 130 may be implemented within DSP 118. In general, controller 130 may perform various control mechanisms, e.g., with regard to attenuator network 120, based on the various detection information received from detection circuitry 125. Still further, controller 130 may cause updates to such attenuators and gain control circuitry to occur at a zero crossing of the RF signal, to reduce or avoid undesired artifacts such as noise, clicks, pops and so forth. And as further shown, controller 130 may provide status information such as zero crossing information to DSP 118, which may perform certain digital compensation operations on the digitized signals responsive to zero crossings at which front end updates are effected.

Another AGC circuit, namely an IF AGC circuit 140, may be coupled to the IF portion of the signal path. As seen, AGC circuit 140 includes a detection circuit 145 that may include multiple detectors such as discussed above with regard to the RF AGC circuit. As such, in addition to a strength of the IF signal, zero crossing information can be detected and provided to a controller 150. In turn, controller 150 provides control information to both PGA 114 (to control its gain) and DSP 118 (including at least zero crossing information) to enable the DSP to perform gain control compensation for changes made to the IF attenuation circuitry on a zero crossing of the IF signal.

Figure 2A:
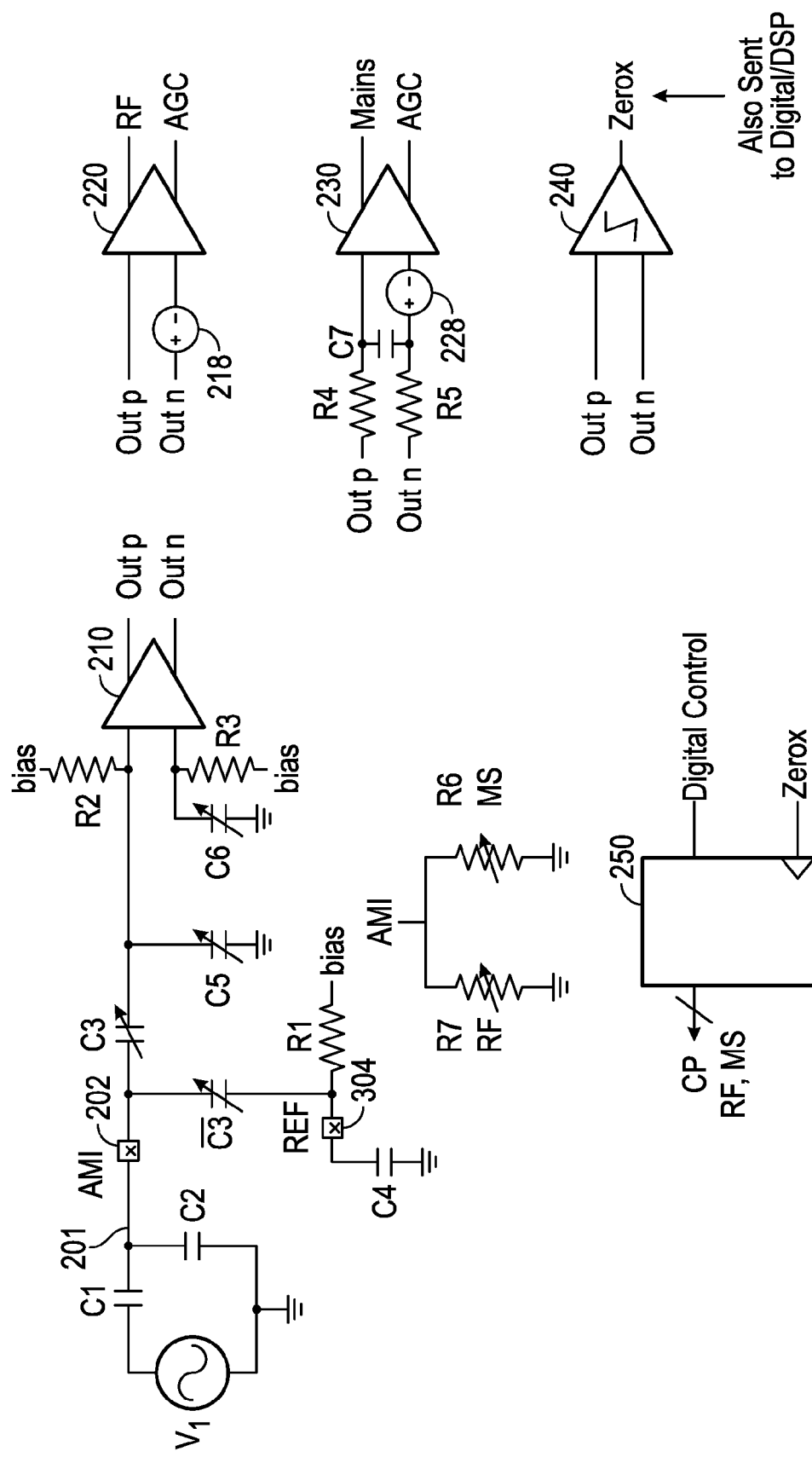
FIG. 2A is a schematic diagram of a portion of a receiver front end.

Referring now to FIG. 2A, shown is a schematic diagram of a portion of a receiver front end in accordance with an embodiment. As shown in FIG. 2A, front end 200 is configured to receive an incoming RF signal from an antenna. In the embodiment shown, the antenna is a whip antenna modeled by C1 and C2 that receive the incoming RF signal $V_i$. In an embodiment, C1 is a 15 picoFarad (pF) capacitor and C2 is a 62 pF capacitor. In turn, the RF input signal is coupled to receiver front end 200 via an input pin 202. The RF input signal is coupled along an input signal path 201 in turn to a LNA 210 through a capacitor C3, which may be part of an attenuator network. More specifically, the attenuator network is implemented as a capacitor attenuation, which in the embodiment of FIG. 2A is configured as a capacitor divider formed via capacitor C3 and capacitor C5. More specifically, capacitor C3 is configured on input signal path 201 and may be a controllable capacitor that has a maximum value of 128 pF, in an embodiment. In an embodiment, capacitor C3 may be implemented as a variable capacitance formed of a plurality of capacitors coupled in parallel such as a capacitor array and having a given weighting (e.g., binary, radix, or another weighting) each controlled by a switching device such as a metal oxide semiconductor field effect transistor (MOSFET). Each of the MOSFETs may be controlled to enable selection of a given capacitor into or out of the input signal path.

Note further that capacitor C3 is coupled to an AC ground node, to the extent that it is not used in the input signal path. More specifically, a portion of capacitor C3 that is not selected for coupling to input signal path 201 (represented as $\overline{C3}$ in FIG. 2A) couples in shunt to an external AC ground via a second pin 204 that couples to the AC ground via a capacitor C4. This non-selected portion of capacitor C3 ($\overline{C3}$) is coupled in this manner to the AC ground node via pin 204 by a corresponding switch such as a MOSFET. Stated another way, this non-selected or unused portion of the total possible capacitance (maximum range) of capacitor C3 is added in parallel with capacitor C2 to shunt off additional amounts of the incoming RF signal for purposes of attenuation. In an embodiment, capacitor C4 is an AC coupling capacitor having a value of approximately 1 microFarad (µF).

As an example, when capacitor C3 is implemented with a maximum range of 128 pF, assume a configuration in which the actual capacitance coupled onto input signal path 201 by control of capacitor C3 is 28 pF. In this situation, the unused or remaining available capacitance of this controllable capacitance, namely 100 pF, is coupled in shunt (as $\overline{C3}$) that couples to an AC ground node. As further seen, a bias voltage couples to pin 204 via a resistor R1. This resistor R1 may be on the order of approximately 1 megaohm and is coupled to a bias voltage that may be, in an embodiment approximately 1.0 volts.

By connecting this capacitor C3 to AC ground to the extent that it is not used in the RF signal path, the capacitive attenuation range of the attenuator network may be extended so that the need for additional attenuation by way of a resistive attenuator can be avoided. This may be useful in that while a capacitive attenuator has substantially constant gain across the input frequency range, a resistive attenuator implements a high pass transfer function. Thus, engaging a resistor attenuator can be detrimental depending on the frequency content of a blocker. Additionally, gain step compensation in a DSP can be much more difficult due to the non-constant gain of the resistor attenuation. Thus by providing a capacitor attenuator as described herein, automatic gain control of the receiver may be improved by extending the range over which capacitive attenuation can be used without additional attenuation being provided by resistive attenuation. As such, the use of this inferior resistive attenuation can be avoided or at least reduced, depending on RF signal strength.

In one embodiment, the capacitive attenuator network formed of capacitors C3 and C5 may provide an attenuation range of approximately 40 dB such that when the incoming RF signals are within a range below this level, the signal can be attenuated to a desired level for processing without the need for additional attenuation via resistors or other attenuation component. Thus the consequences of such resistor attenuation can be avoided for most cases of incoming RF signals.

Capacitor C5 is coupled in shunt to input signal path 201 (more specifically between input signal path 201 and an AC reference node), and may be a controllable capacitor that has a maximum value of 60 pF, in an embodiment. Capacitor C5 may be similarly configured with multiple individual capacitors each controllable by a corresponding switch such as a MOSFET.

Still referring to FIG. 2A, the RF input signal couples to a first input terminal of LNA 210. This first input terminal is further coupled to receive a bias voltage coupled via a resistor R2. A second input terminal of LNA 210 is coupled to an AC ground node via a capacitor C6. The value of capacitor C6 may be chosen to match the capacitance on the other side of the LNA. The second input terminal is further coupled to receive a bias voltage coupled to a resistor R3. LNA 210 operates to amplify the RF input signal and output a differential amplified RF signal formed of differential output portions OutP and OutN.

Still referring to FIG. 2A, a plurality of DC-coupled detectors are configured to receive the amplified RF signal output from LNA 210. In different embodiments RF detection circuitry can be coupled either before or after the LNA, with threshold values being adjusted depending on where the detectors are connected. In the embodiment of FIG. 2A, the detection circuitry is coupled to an output of the LNA 210. An RF AGC detector 220 is configured to receive the amplified RF signal. As shown in FIG. 2A, a threshold voltage 218 may further be applied to one of the differential paths (specifically the negative differential path OutN in the embodiment of FIG. 2A). The resulting output of detector 220 thus indicates a level of the RF signal, which is provided to a DSP, MCU, other digital logic or other controller for use in determining an appropriate amount of attenuation to apply via the capacitive attenuator network. For example, a standalone AGC logic circuit may be configured to receive the output of detector 220 and control at least some of the front end attenuation network components based at least in part on this output. Note that threshold voltage 218 also may be controlled by an appropriate controller such as an AGC logic circuit, and may be set based at least in part on whether the RF signal is received before or after amplification in the LNA.

The amplified RF signal is further coupled to a low frequency noise detector 230. For detector 230, the amplified RF signal is first filtered by a low pass filter formed of resistors R4 and R5 in parallel with capacitor C7. As shown in FIG. 2A, a threshold voltage 228 may further be applied to one of the differential paths (specifically the negative differential path OutN in the embodiment of FIG. 2A), and may be set based at least in part on whether the RF signal is received before or after amplification in the LNA. Detector 230 thus detects the low frequency noise, e.g., resulting from location of the receiver in relatively close range to high voltage power signals or other sources of low frequency noise. Note that detector 230 is band limited and has a lower threshold voltage 228 than threshold voltage 218 for detector 220. As described further below, the output of detector 230 may be used to independently control a resistor attenuator to eliminate low frequency noise and simplify AGC operation. That is, the resulting output of detector 230 indicates a level of low frequency noise, which is provided to a DSP, MCU, other digital logic or other controller for use in determining an appropriate amount of attenuation to apply via the resistor attenuator network.

Still further, the amplified RF signal is coupled to a Schmitt trigger 240 that is used to determine zero crossings of the RF signal. The zero crossings may be detected when the positive portion of the amplified RF signal is substantially equal to the negative portion of the amplified RF signal. In this instance, a zero detection is indicated to a control logic 250. As seen, control logic 250 receives this zero detection signal as a clock signal to enable digital control signals to be provided to the controllable impedances of the analog front end. These digital control signals may be received from a DSP, MCU or other digital logic that generates multi-bit digital control signals based on the outputs of the different detectors described above. Note that these digital control signals are not provided to the appropriate controllable impedances until detection of a zero crossing of the RF signal. Responsive to receipt of these control signals the controllable impedances update their impedance values during this zero crossing event, to prevent impulsive transients since the attenuator components do not receive a change in voltage on an update event. As a result, improved audio quality is realized on a demodulator output. Furthermore, note that information regarding zero crossing events may further be provided to DSP circuitry to enable amplitude compensation to occur during demodulation processing. By providing AGC updates on RF zero crossings, desired channel corruption is minimized. In this way, integrated power line noise management is realized.

As further shown in FIG. 2A, a resistive attenuator network for low frequency noise may be provided by way of a variable resistor R6 coupled between input pin 202 and a reference voltage node. This resistor thus operates as a high pass filter to attenuate the low frequency noise such as from power lines or other low frequency noise sources and pass the remainder of the RF signal onto the receiver circuitry. In an embodiment, resistor R6 may be a variable resistance formed of a plurality of resistors coupled in parallel and having a given weighting (e.g., binary, radix or another weighting) each controlled by a switching device such as a MOSFET. Each of the MOSFETs may be controlled to enable selection of the given resistor into or out of the circuit. In one such embodiment, the range of variable resistor R6 may be on the order of approximately 10 Megohms to 10 kiloohms.

Similarly, an additional resistive attenuator network formed of a variable resistor R7 may be used to provide additional RF signal attenuation capabilities. Resistor R7 may be similarly formed as R6, but may have a range of approximately 10 kiloohms to 10 ohms. Note that in many (or most) use cases, the need for attenuation using this resistive attenuator for RF signals can be avoided. However, in some instances such as in the presence of very strong RF signals, e.g., when in close location to an AM signal source such as an AM transmitter, the additional attenuation provided by this resistive attenuator network may be used. Thus, when a capacity of the capacitor attenuator to appropriately reduce a level of the incoming RF signal is exceeded, the attenuation realized by resistive attenuator R7 is used. Note also that these two resistive attenuators are independently controlled.

Using an arrangement as in FIG. 2A, the need for an external mains trap can be avoided. Accordingly, the resulting size, complexity and expense associated with such trap can be avoided, reducing an overall implementation's size and cost.

Figure 2B:
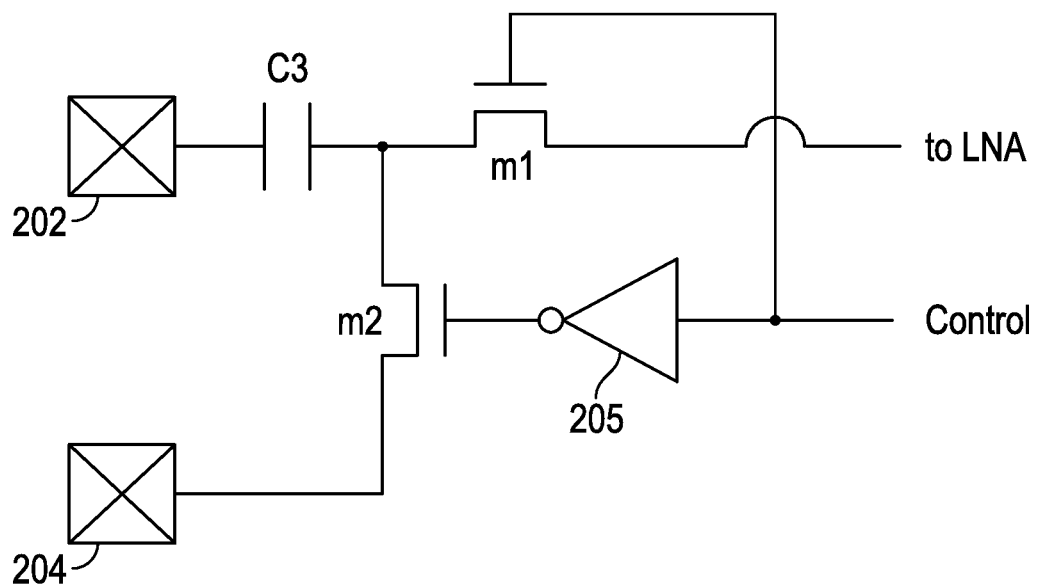
FIG. 2B is a schematic diagram of an implementation of a portion of a capacitor attenuator.

Referring now to FIG. 2B, shown is a schematic diagram of an implementation of a portion of a capacitor attenuator in accordance with an embodiment. As shown in FIG. 2B, capacitor C3 may be one of multiple capacitors of a capacitor array that together forms capacitor C3 (and $\overline{C3}$) in the FIG. 2A implementation. As seen, each capacitor of this capacitor array may be implemented as a single capacitor coupled on input signal line 201 between input terminal 202 and LNA 210 (not shown for ease of illustration in FIG. 2B).

More specifically, when enabled by control of a first switch M1, the given capacitance of the capacitor is coupled to input signal path 201. When switch M1 is enabled, switch M2 is disabled via control of this switch by an inverted version of the control signal via an inverter 205. As such, this given capacitor is not coupled to an AC ground node via second pin 204. When the control signal switches state, switch M1 disables connection of the capacitor to the LNA and instead the given capacitor couples to the AC ground node via enabled switch M2 and in shunt with the input signal line via terminal 204. Of course understand while shown with this particular implementation in FIG. 2B, other implementations are possible. For example rather than a single control signal and multiple switches controlling connection of a single capacitor, multiple control signals may be used to control multiple switches to replicate the same control. Or another circuit configuration is possible.

Figure 3:
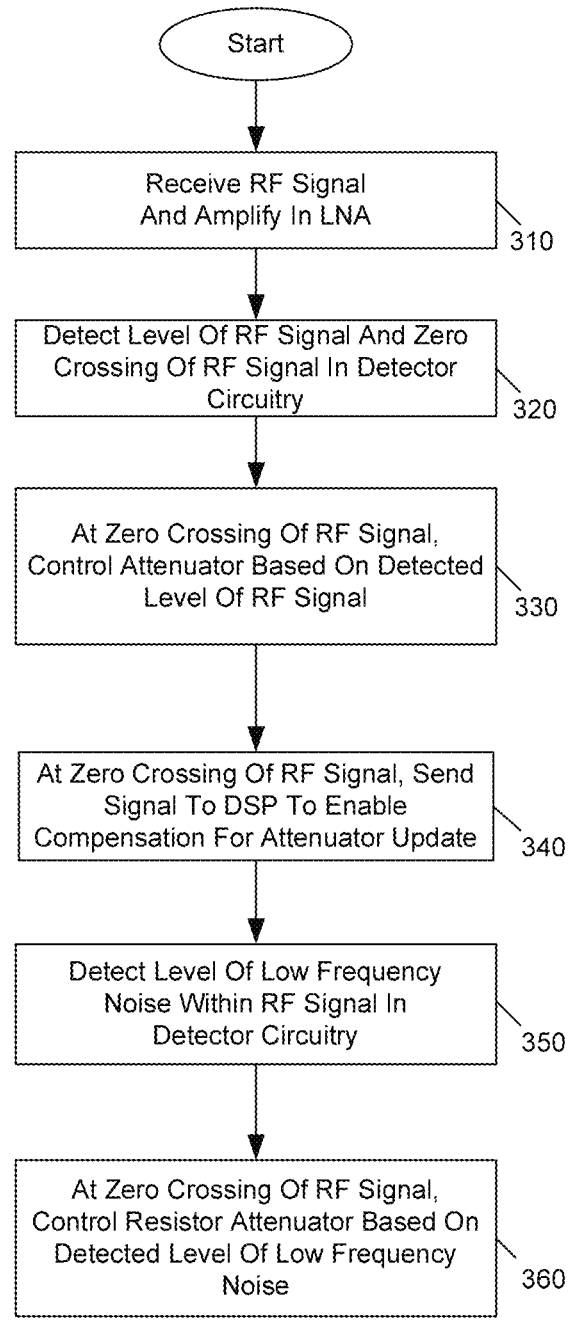
FIG. 3 is a flow diagram of a method for controlling one or more attenuation networks.

Referring now to FIG. 3, shown is a flow diagram of a method in accordance with an embodiment. As shown in FIG. 3, method 300 generally shows the operation of a radio receiver to control one or more front end attenuation networks based on a received RF signal. More specifically as seen in FIG. 3, method 300 begins by receiving an RF signal and amplifying the signal in a LNA (block 310). As an example, the RF signal is received from an antenna and coupled through an input signal path to the LNA which performs amplification of the RF signal and also transforms the signal into a differential signal. Next at block 320 a level of the RF signal is detected in a first detector. In different implementations, this RF signal detection may be from a location prior to amplification in the LNA or after the RF signal has been amplified in the LNA. In an embodiment, this first detector is a wideband detector that detects a level of the RF signal based on the RF signal. Responsive to this detection, a capacitor attenuator can be controlled (block 330). More specifically, at a zero crossing of the RF signal, an update can be made to the attenuation value of the capacitor attenuator. In an embodiment, this capacitor attenuator may include multiple shunt paths such as described above with regard to FIG. 2A. Also note here that if the strength of the RF signal exceeds a predetermined threshold such as when the receiver is in close proximity to a transmission antenna, a resistor attenuator may be enabled. Next control passes to block 340 where at this zero crossing, an additional signal may be sent to the DSP. More specifically, the signal, which may be a status signal, is used to indicate to the DSP the occurrence of a zero crossing at which one or more of the attenuators of the signal path are updated. Due to these changes, which occurred at a zero crossing, the DSP may perform digital compensation due to the update to the attenuators. In an embodiment, such digital compensation may include adjusting a level of the signal provided for processing to account for the change in attenuator level. For example, the digital signal may be amplitude scaled based on the AGC amplitude change.

Still referring to FIG. 3, next at block 350, a level of low frequency noise is detected in a second detector. In an embodiment, this second detector is a band limited detector that detects a level of low frequency noise based on a filtered version of the RF signal. Responsive to this detection, another resistor attenuator can be controlled to enable filtering of the low frequency noise (block 360). More specifically, at a zero crossing of the RF signal, an update can be made to the attenuation value of the resistor attenuator. Note that the order of operations shown in FIG. 3 is for ease of discussion and in a particular implementation different ordering of these operations may occur. For example, control of the resistor attenuator may occur prior to controlling the capacitor attenuator. And as described herein because embodiments may perform updates to attenuator settings at a zero crossing, update to the control of both the resistor and capacitor attenuators may occur concurrently.

Figure 4:
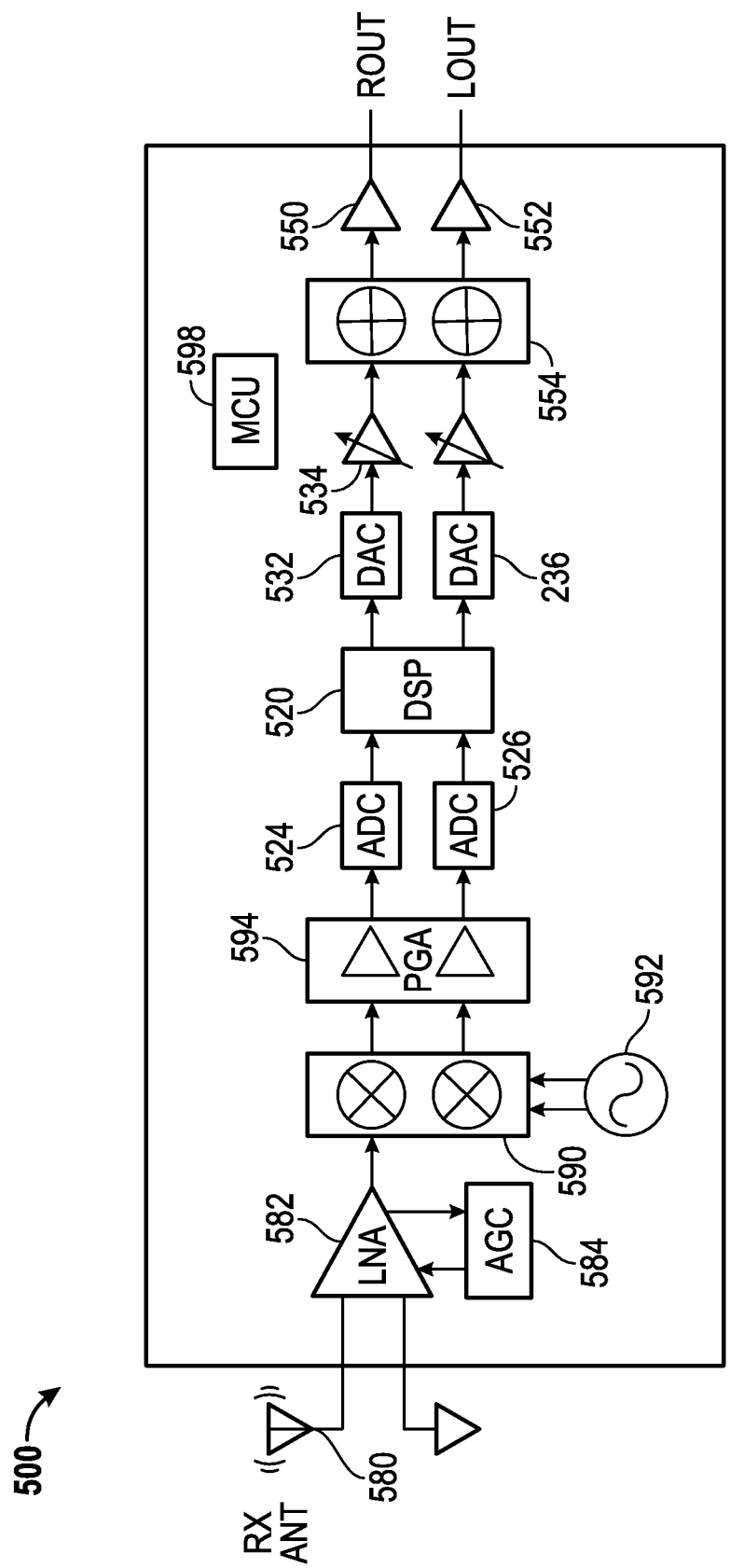
FIG. 4 is a block diagram of a multi-band receiver system in accordance with an embodiment.

Embodiments may be implemented in many different receivers, transceivers and so forth. In some implementations, a radio receiver capable of both AM and FM receive modes, among others, may implement embodiments. Referring now to FIG. 4, shown is a block diagram of a multi-band receiver system 500 in accordance with an embodiment. In one embodiment, system 500 may be a mobile radio such as a car radio. As shown in FIG. 4, a multimode combined AM/FM/WB receiver 500 may be fabricated on a monolithic semiconductor die.

An incoming RF signal is received from an external receive antenna 580 through a LNA 582 controlled by an automatic gain control (AGC) circuit 584. After processing, left channel (called "LOUT") and right channel (called "ROUT") analog stereo signals appear at output terminals 552 and 550, respectively.

The multimode receiver 500 includes analog mixers 590 that are coupled to a tunable local oscillator 592, the frequency of which selects the desired radio channel to which the receiver 500 is tuned. In response to the incoming RF signal, the mixers 590 produce corresponding analog IF, quadrature signals that pass through PGAs 594 before being routed to the ADCs 524 and 526. Thus, the ADCs 524 and 526 convert the analog IF quadrature signals from the PGAs 594 into digital signals, which are provided to a DSP 520.

The DSP 520 demodulates the received complex signals and processes them as described above to provide corresponding digital left and right channel stereo signals at its output terminals; and these digital stereo signals are converted into analog counterparts by DACs 532 and 536, respectively, which are coupled to programmable gain amplifiers 534. A microcontroller unit (MCU) 598 may perform control operations for setting a mode of operation and control of controllable features of the receiver, such as the controllable front end attenuation networks described above.

Figure 5:
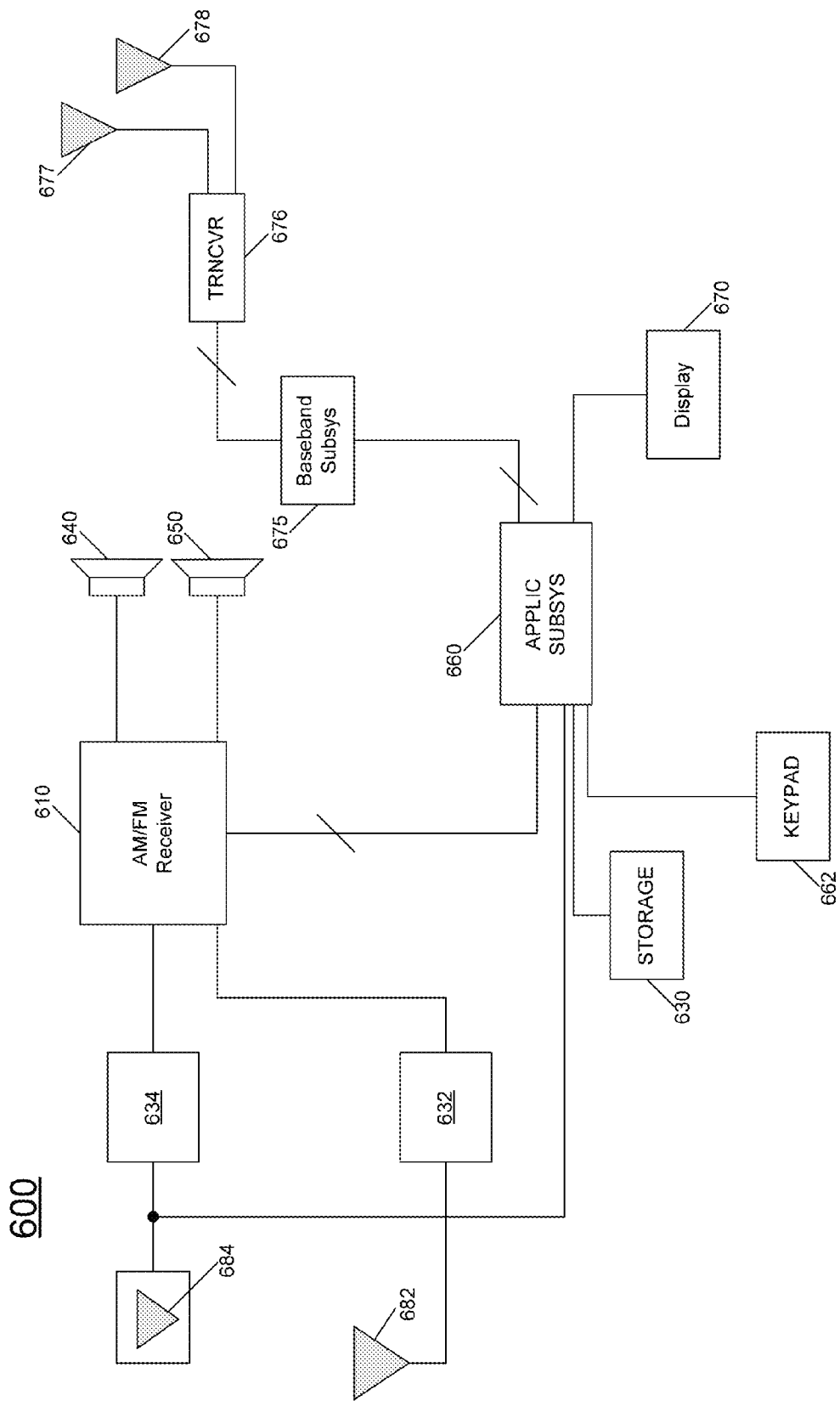
FIG. 5 is a block diagram of a system in accordance with one embodiment.

Referring to FIG. 5, in accordance with some embodiments, an AM/FM receiver 610 (such as an implementation of that shown in the embodiment of FIG. 4) may be part of a multimedia device 600. As examples, the device 600 may be an automobile entertainment system, a portable wireless device such as a dedicated MP3 player, a cellular telephone or PDA with audio capabilities, or other such devices.

Among its other functions, the device 600 may store digital content on a storage 630, which may be a flash memory, hard disk drive, or an external device such as a portable media player, as a few examples. The device 600 generally includes an application subsystem 660 that may, for example, receive input from a keypad 662 of the device 600 and display information on a display 670. Furthermore, the application subsystem 660 may generally control the retrieval and storage of content from the storage 630 and the communication of, e.g., audio with the AM/FM receiver 610. As shown, AM/FM receiver 610 may be directly connected to speakers 640 and 650 for output of audio data. As depicted in FIG. 5, the AM/FM receiver 610 may be coupled by a matching network 632 to an FM receiver antenna 682 and may be coupled by a matching network 634 to an AM receiver antenna 684, which can be tunable or programmable, e.g., via application subsystem 660 that provides control information to control matching network 634.

In accordance with some embodiments, device 600 may also have the ability to communicate over a communications network, such as a cellular network. For these embodiments, the device 600 may include a baseband subsystem 675 that is coupled to the application subsystem 660 for purposes of encoding and decoding baseband signals for this wireless network. Baseband subsystem 675 may be coupled to a transceiver 676 that is connected to corresponding transmit and receive antennas 677 and 678.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    an input terminal to receive a radio frequency (RF) signal and to communicate the RF signal to a low noise amplifier (LNA) via an input signal path; and
    a capacitor attenuator coupled to the input terminal to attenuate the RF signal by a controllable amount and having a first portion controllable to include a used part configured on the input signal path and an unused part coupled between the input signal path and an AC reference node, and a second portion coupled between the LNA and the AC reference node, wherein a capacitance of the first and second portions is responsive to a strength of the RF signal.

2. The apparatus of claim 1, further comprising a second terminal to couple to the AC reference node that is external to the apparatus, wherein the unused part of the first portion is coupled to the second terminal, and further comprising an external capacitor coupled between the second terminal and the AC reference node.

3. The apparatus of claim 1, wherein the input signal path is coupled to communicate the RF signal to a first input terminal of the LNA, and the AC reference node is coupled via a capacitor to a second input terminal of the LNA.

4. The apparatus of claim 1, further comprising a detector to generate a crossing signal responsive to detection of a zero crossing of the RF signal.

5. The apparatus of claim 4, further comprising a control logic to receive at least one control signal and to provide the at least one control signal to control at least the first portion of the capacitor attenuator upon the zero crossing of the RF signal.

6. The apparatus of claim 1, wherein the first portion includes a plurality of capacitors, each having a first terminal coupled to the input terminal and a second terminal coupled to a switching node, the switching node to couple to the LNA via a first switch and to couple to the AC reference node via a second switch.

7. The apparatus of claim 6, wherein the first switch is controlled via a first control signal and the second switch is controlled via a second control signal.

8. The apparatus of claim 1, further comprising a first detector to receive the RF signal and to generate a first automatic gain control (AGC) signal based on comparison of the RF signal to a first threshold value, wherein the capacitor attenuator is controlled responsive to the first AGC signal.

9. The apparatus of claim 8, further comprising a second detector to receive the RF signal via a low pass filter and to generate a second AGC signal based on comparison of the RF signal to a second threshold value.

10. The apparatus of claim 9, further comprising a second resistor attenuator coupled to the input terminal to further attenuate the RF signal when the RF signal is greater than a predetermined threshold.

11. The apparatus of claim 10, wherein the second resistor attenuator is disabled when an attenuation range of the capacitor attenuator is sufficient to fully attenuate the RF signal, wherein the RF signal is less than the predetermined threshold.

12. The apparatus of claim 9, further comprising a first resistor attenuator coupled to the input terminal to attenuate low frequency noise, the first resistor attenuator controllable based at least in part on the second AGC signal.

* * * * *